United States Patent
Hasan et al.

(10) Patent No.: US 10,135,269 B2
(45) Date of Patent: Nov. 20, 2018

(54) MINIMIZE BULK CAPACITANCE AND PREVENT CONTROLLER RESETS DUE TO THE VOLTAGE DROP ASSOCIATED WITH A FAULT CONDITION

(71) Applicant: GM GLOBAL TECHNOLOGY OPERATIONS LLC, Detroit, MI (US)

(72) Inventors: S M N Hasan, Novi, MI (US);
Timothy P Philippart, Orion, MI (US);
Sam Barakat, Wixom, MI (US)

( * ) Notice: Subject to any disclaimer, the term of this patent is extended or adjusted under 35 U.S.C. 154(b) by 243 days.

(21) Appl. No.: 15/211,800

(22) Filed: Jul. 15, 2016

(65) Prior Publication Data

US 2018/0019602 A1    Jan. 18, 2018

(51) Int. Cl.
| | | |
|---|---|---|
| *H02H 7/18* | (2006.01) | |
| *H02J 7/00* | (2006.01) | |
| *H03K 17/687* | (2006.01) | |
| *H02J 7/34* | (2006.01) | |

(52) U.S. Cl.
CPC .......... *H02J 7/0029* (2013.01); *H02J 7/0031* (2013.01); *H02J 7/345* (2013.01); *H03K 17/687* (2013.01); *H02J 2007/0039* (2013.01)

(58) Field of Classification Search
CPC ................................................... H02J 7/0029
See application file for complete search history.

(56) References Cited

U.S. PATENT DOCUMENTS

| | | | | |
|---|---|---|---|---|
| 4,203,151 | A * | 5/1980 | Baker | H02M 7/487 363/132 |
| 2013/0257149 | A1* | 10/2013 | White | H02J 7/0031 307/10.1 |
| 2017/0368957 | A1* | 12/2017 | Lei | B60L 11/1861 |

OTHER PUBLICATIONS

U.S. Application Filing date Nov. 5, 2015; U.S. Appl. No. 14/933,394, Applicant: GM Global Technology Operations LLC; Title: Self Turn-On and Turn-Off Pre-Charge Circuit to Limit Bulk Capacitor Inrush Current.
U.S. Application Filing date Nov. 24, 2015; U.S. Appl. No. 14/950,505, Applicant: GM Global Technology Operations LLC; Title: System and Method for Controlling a Transmission When a Fault is Diagnosed in a Transmission Control System.

* cited by examiner

*Primary Examiner* — Jared Fureman
*Assistant Examiner* — Duc M Pham

(57) ABSTRACT

A circuit for connecting a voltage source to a load is provided. The circuit may include a Vbatt node configured to be connected to a voltage source and a diode electrically connected with the Vbatt node. A battery isolation switch module is electrically connected with the diode, the diode being arranged in series between the battery isolation switch module and the Vbatt node. A capacitor bank is electrically connected with the battery isolation switch module and to ground. The capacitor bank is configured to be further connected with a microprocessor power supply. A high side driver may be configured to receive power from the voltage source. The diode is configured to isolate the capacitor bank and the power supply. The diode is arranged to prevent current from flowing back through the diode from the battery isolation switch module and the capacitor bank to the Vbatt node or HSD output.

20 Claims, 4 Drawing Sheets

MINIMIZE BULK CAPACITANCE AND PREVENT CONTROLLER RESETS DUE TO THE VOLTAGE DROP ASSOCIATED WITH A FAULT CONDITION

FIELD

The present disclosure relates to circuits, and more particularly, to circuits for connecting a voltage source to a load.

INTRODUCTION

A transmission control unit typically includes a control circuit including a driver configured control output to a load. The load typically includes solenoids that are used to control actuation of clutch control lines. For example, the transmission control unit typically controls a plurality of solenoids to shift gears in a transmission. In one example, the transmission control system energizes (e.g., opens) one or more solenoids to shift the transmission to a particular gear. The transmission control unit energizes a solenoid by adjusting the amount of current supplied to the solenoid. Energizing the solenoid changes the level of hydraulic pressure that is used to actuate a plurality of clutches in the transmission. In one example, the transmission control unit increases the amount of current supplied to a solenoid to energize the solenoid, which increases the hydraulic pressure and thereby actuates a transmission clutch.

Typically, a transmission control unit is powered by a motor vehicle's 12 Volt battery. A transmission control unit may also include a microprocessor power supply, or main power supply, for the transmission control unit controller itself. However, depending on the ASIC used, the controller will reset if the voltage supplied to the microprocessor power supply is below a threshold required for the microprocessor of the transmission control unit. For a 1 A non-boosted microprocessor power supply, the threshold below which the power supply cannot provide enough voltage to the microprocessor is typically 5 Volts or 6 Volts. If the circuit voltage at the microprocessor power supply drops below this threshold, the controller will reset.

Normally, the voltage in the transmission control circuit is in the range of about 12 Volts, as supplied by the vehicle battery. To control variations in voltage levels, a capacitor bank is arranged at the microprocessor power supply and the driver that is used to provide output voltage to the solenoids. The output of the driver is designed to drive a load having a resistance and inductance, and provide current when it is operating. If a short circuit to the ground occurs at the driver output, the resistance will drop close to zero, and the capacitor banks will discharge almost instantaneously. Therefore, current will spike to a very high level. A spike in current causes the voltage to drop in the wiring harness resistance between battery and controller input, and the voltage at the controller input as well as at the microprocessor power supply input may drop below the threshold needed for the controller to operate. If this occurs, the controller will reset. Once the controller is back on, and the short is not removed, it will reset again as soon as the driver turns ON. A loop of controller reset may occur, rendering the transmission control unit inoperable. Accordingly, there is a need for a transmission control circuit that prevents unwanted resets of the transmission controller.

SUMMARY

The present disclosure provides voltage source connection architecture that minimizes bulk capacitance needed during a short circuit condition to avoid too large or too quick of a voltage drop at the input of microprocessor power supply of the transmission control circuit during a short circuit fault. As a result, the microprocessor power supply is spared from resetting due to voltage dropping below the reset threshold.

In one form, which may be combined with or separate from the other forms described herein, a connection circuit for connecting a voltage source to a main load is provided. The connection circuit includes a Vbatt node of the controller configured to be electrically connected to a voltage source. A blocking diode is electrically connected to the Vbatt node. A battery isolation switch module is electrically connected between the blocking diode and a microprocessor power supply input capacitor bank, the blocking diode being arranged in series between the battery isolation switch module and the Vbatt node. The blocking diode is arranged to prevent current from flowing back through the blocking diode from the microprocessor power supply input capacitor bank to the Vbatt node or to the driver output especially during a short circuit condition. A microprocessor power supply input capacitor bank is electrically connected to the battery isolation switch module at a first end of the microprocessor power supply input capacitor bank. The microprocessor power supply input capacitor bank is connected to ground at a second end of the microprocessor power supply input capacitor bank. The first end of the microprocessor power supply input capacitor bank is configured to be further connected with a power supply.

In another form, which may be combined with or separate from other forms described herein, an automotive control circuit for controlling an automotive system is provided. The automotive control circuit includes a high side driver configured to receive power from a voltage source and drive a load. A high side driver (HSD) capacitor bank is arranged to provide stored electrical charge to the high side driver. A microprocessor power supply for powering the automotive control circuit is included, where the microprocessor power supply is configured to reset if voltage supplied to the microprocessor power supply drops below a predetermined threshold. A microprocessor power supply input capacitor bank is arranged to provide stored electrical charge to the microprocessor power supply. A blocking diode is configured to isolate the microprocessor power supply input capacitor bank and the microprocessor power supply from a fast voltage drop caused by a short circuit of the high side driver to ground.

The circuit may include additional features, such as: the blocking diode being a Schottky diode; a HSD capacitor bank electrically connected to the Vbatt node at a first end of the HSD capacitor bank; the HSD capacitor bank being connected to ground at a second end of the HSD capacitor bank; a high side driver electrically connected to the Vbatt node at a first node of the high side driver; the first node of the high side driver being further electrically connected to the first end of the HSD capacitor bank; the high side driver being configured to be electrically connected to the main load at a second node of the high side driver; the microprocessor power supply input capacitor bank comprising two or more capacitors arranged in parallel with each other, with a first end of the power supply input capacitor bank being electrically connected to the battery isolation switch module and a second end of the microprocessor power supply input capacitor bank being connected to ground; the microprocessor power supply being provided and electrically connected to the first end of the microprocessor power supply input capacitor and to the battery isolation switch module; the HSD capacitor bank being a first HSD capacitor.

Further additional features may be included, such as: a reverse battery protection module electrically connected to the Vbatt node at a first node of the reverse battery protection module; a second node of the reverse battery protection module being electrically connected to the first end of the HSD capacitor bank and to the HSD; the reverse battery protection module having a diode, or a MOSFET with a body diode; a wake-up module having a first node in electrical connection with the second node of the reverse battery protection module, the first end of the HSD capacitor bank, and the high side driver; the wake-up module having a second node electrically connected to the battery isolation switch module; the wake-up module having a third node configured to be electrically connected to a wake-up signal source coming from outside of the controller; a gate resistor electrically connected to a third node of the reverse battery protection module and to ground; a gate-to-source resistor connected in between the source and gate of the reverse battery protection device; the battery isolation switch module comprising an isolation MOSFET; an s-terminal of the isolation MOSFET being electrically connected to the blocking diode; a d-terminal of the isolation MOSFET being electrically connected to the first end of the microprocessor power supply input capacitor bank and to the microprocessor power supply; the battery isolation switch module further comprising a first battery isolation resistor electrically connected to a g-terminal of the isolation MOSFET and to a first terminal of an enabler switch; the battery isolation switch module further comprising a second battery isolation resistor electrically connected to the g-terminal and the s-terminal of the isolation MOSFET; the enabler switch having a first terminal electrically connected to the first battery isolation resistor; the enabler switch having a second terminal connected to ground and a third terminal electrically connected to a wake-up isolation resistor; the battery isolation switch module further comprising a third battery isolation resistor electrically connected to the second and third terminals of the enabler switch; the wake-up isolation resistor being electrically connected to the second node of the wake-up module; the high side driver comprises a high side driver MOSFET; the battery isolation switch module being configured to isolate the microprocessor power supply from the voltage source in an off state of the microprocessor power supply; the blocking diode being configured to restrict the rate of discharge of the power supply input capacitor bank when the high side driver is short circuited to ground; the blocking diode being arranged to prevent current from flowing back through the blocking diode from the power supply input capacitor bank to the Vbatt node and to the high side driver output; wherein the power supply capacitor bank provides a bulk capacitance in the range of about 45 to about 60 µF; wherein a short circuit of the high side driver to ground causes a controller input voltage (Vbatt node) to drop, and a voltage at the microprocessor power supply to drop at different rate, but be maintained by the control circuit above a predetermined threshold; a 12 Volt voltage source connected to the Vbatt node; the microprocessor power supply causing a load demand in the range about 0.5 A to about 1.5 A; and the predetermined threshold being greater than or equal to 6 Volts.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

In the drawings, reference numbers may be reused to identify similar and/or identical elements.

DETAILED DESCRIPTION

The description below is for illustration purposes only, and is not meant to limit the invention, its applications, or its uses.

Figure 1:
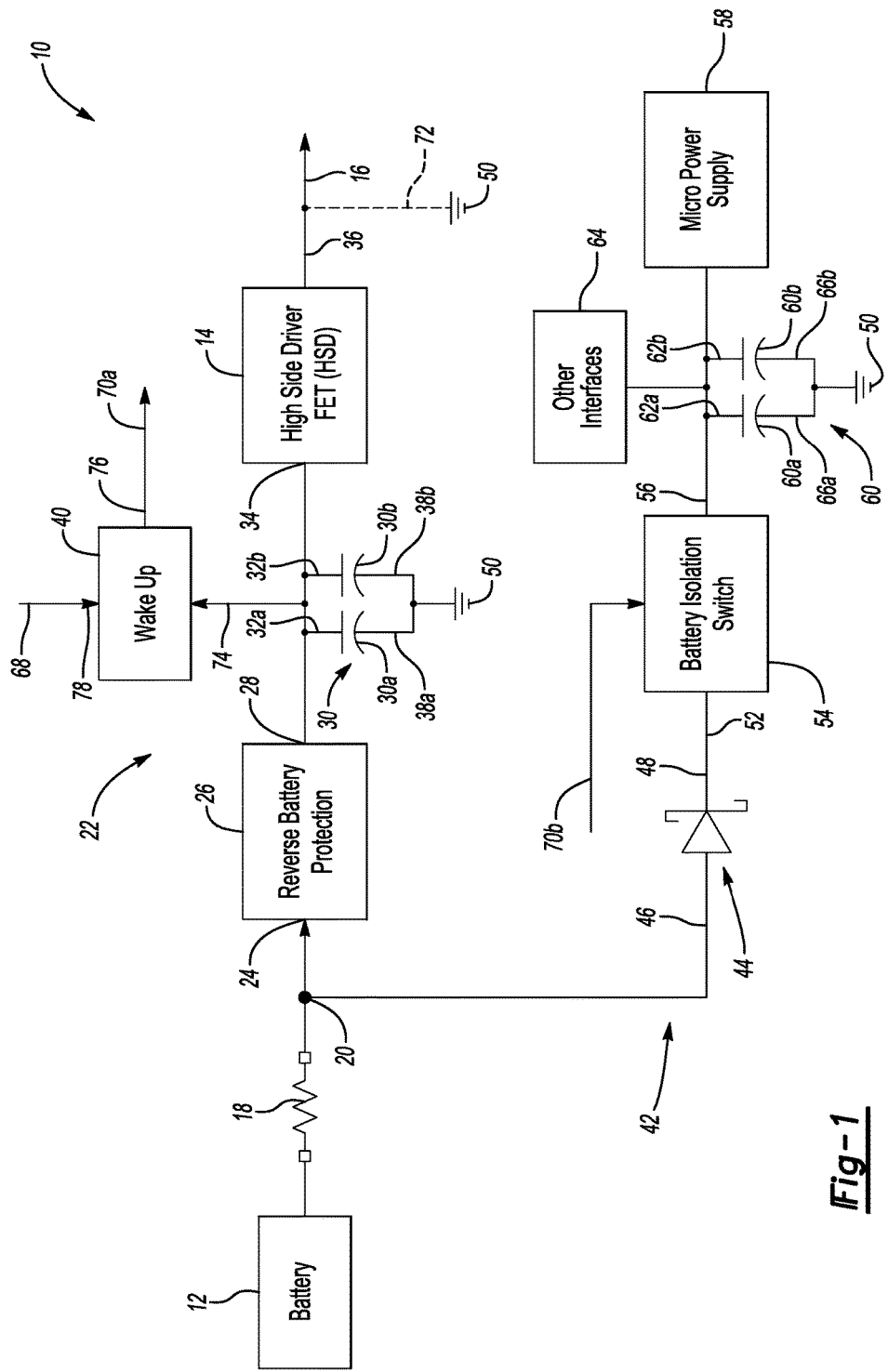
FIG. 1 is a functional block diagram of a portion of an automotive transmission control circuit, in accordance with the principles of the present disclosure.

Referring now to FIG. 1, a transmission control unit circuit according to the present disclosure is schematically illustrated in a block diagram and generally designated at 10. The transmission control unit circuit 10 is configured to be connected to a voltage source, such as a 12 Volt vehicle battery 12, and the circuit 10 includes a high side driver 14 that has an output 16 configured to be connected to a main load (load not shown). Typically, the main load includes a plurality of solenoids for controlling shifting within an automotive transmission. Thus, the circuit 10 is a connection circuit for connecting a voltage source to a main load, and it may be applied to other types of controllers, aside from the transmission control unit illustrated. For examples, the elements disclosed herein can be used in a body controller or an engine controller. The high side driver 14 is configured to receive power from the voltage source (battery 12) to drive the load.

The battery 12 is connected by a wiring harness 18 to a Vbatt node 20 of the circuit 10. The wiring harness 18 typically has some small resistance, such as a resistance of 0.2 Ohm. The Vbatt node 20 may be a pin on the transmission control unit, which is electrically and mechanically connected to the wiring harness 12. In a first path 22 of the circuit 10, the Vbatt node 20 is electrically connected to a first node 24 of a reverse battery protection module 26. Example components of the reverse battery protection module 26 will be described in greater detail when explain with respect to FIGS. 2 and 3 below.

A second node 28 of the reverse battery protection module 26 is electrically connected to a HSD capacitor bank 30. The HSD capacitor bank 30 may include one or more HSD capacitors 30a, 30b. Each of the HSD capacitors 30a, 30b are connected in parallel, with first ends 32a, 32b being electrically connected to the second node 28 of the reverse battery protection module 26. The second node 28 of the reverse battery protection module 26 and the first ends 32a, 32b of the HSD capacitors 30a, 30b of the HSD capacitor bank 30 are electrically connected to a first node 34 of the high side driver (HSD) 14. A second node 36 of the high side driver 14 is electrically connected to the output 16. Second ends 38a, 38b of each of the HSD capacitors 30a, 30b are connected to ground 50. The second node 28 of the reverse battery protection module 26, the first ends 32a, 32b of the HSD capacitor bank 30, and the first node 34 of the high side driver 34 are also in electrically connected with a wake-up module 40, which will be described below.

In a second path 42 of the circuit 10, a blocking diode 44 is electrically connected at a first end 46 to the Vbatt node 20. The blocking diode 44 is preferably a Schottky diode. A Schottky diode has a low voltage drop of about 0.3 V. The blocking diode 44 has a second end 48 that is further electrically connected to a battery isolation switch module 54. Thus, the blocking diode 44 is arranged in series between the Vbatt node 20 and the battery isolation switch module 54. The battery isolation switch module 54 may help minimize large amounts of leakage current from the voltage source when the controller is off.

The battery isolation switch module 54 has a second node 56 that is electrically connected to a microprocessor power supply 58 and a microprocessor power supply input capacitor bank 60. Though element 58 is referred to as a "microprocessor power supply," it should be understood that use of the term "microprocessor power supply" throughout this document includes power supplies that may control or drive items in addition to a microprocessor. Like the HSD capacitor bank 30, the microprocessor power supply input capacitor bank 60 may include one or more power supply input capacitors 60a, 60b. Each of the power supply input capacitors 60a, 60b are connected in parallel, with first ends 62a, 62b being electrically connected to the second node 56 of the battery isolation switch module 54. The second node 56 of the battery isolation switch module 54 and the first ends 62a, 62b of the power supply input capacitor bank 60 are electrically connected to the microprocessor power supply 58, and optionally other interfaces 64, such as other inputs/outputs including pressures sensors and the like. Second ends 66a, 66b of each of the power supply input capacitors 60a, 60b are connected to ground 50.

The wake-up module 40 may be a transceiver powered by the battery 12 and configured to send a signal in a protocol such as CAN or LIN on output line 70a to the battery isolation switch module 54 along input 70b. Though not shown, it should be understood that output 70a and input 70b are electrically connected. The wake-up module 40 may include a switch, and may be configured to send a serial data message along the output line 70a. The wake-up module 40 has a first node 74 in electrical connection with the second node 28 of the reverse battery protection module 26, the first ends 32a, 32b of the HSD capacitor bank 30, and the high side driver 14. The wake-up module 40 has a second node 76 electrically connected to the battery isolation switch module 54, and the wake-up module 40 has a third node 78 configured to be electrically connected to the wake-up signal source outside the transmission control circuit via electrical line 68.

In the circuit 10, the microprocessor power supply input capacitor bank 60 and the microprocessor power supply 58 are isolated from the high side driver capacitor bank 30 by the blocking diode 44. The blocking diode 44 is arranged to prevent current from flowing back through the blocking diode 44 from the path of the battery isolation switch module 54 including the microprocessor power supply input capacitor bank 60 to the Vbatt node 20. The blocking diode 44 also acts as a reverse battery protection circuit for the microprocessor power supply 58.

During normal operation of the transmission control unit circuit 10, the battery 12 provides a voltage to the circuit 10, and the capacitor banks 30, 60 store up charge within the circuit 10. The microprocessor power supply 58 and other interfaces 64 can make up a load in the range of about 0.5 Amp to about 1.5 Amp, or about 0.8 Amp to about 1.0 Amp.

When a fault occurs, or more specifically, when there is a short circuit of the high side driver 14 to ground 50 (shown at dashed line 72), resistance at the output 16 goes close to zero. Accordingly, the capacitor banks 30, 60 would normally discharge at a high rate and correspondingly cause the current to spike (up to about 60 Amps), and the voltage at the microprocessor power supply input 58 to drop, perhaps even below 6 V.

However, with the blocking diode 44 in place, the microprocessor power supply input capacitor bank 60 does not discharge through the short circuit path. Instead, the microprocessor power supply input capacitor bank 60 only discharges at the rate of the microprocessor power supply 58 and other interfaces 64 load current. Thus, the blocking diode 44 is configured to isolate the microprocessor power supply input capacitor bank 60 and the microprocessor power supply 58 from a fast voltage drop caused by a short circuit of the high side driver 14 to ground 50. The blocking diode 44 is configured to restrict the rate of discharge of the power supply input capacitor bank 60 when the high side driver 14 is short circuited to ground 50. As a result, a much smaller amount of capacitance in the microprocessor power supply input capacitance bank 60 is required to keep the power supply input voltage about 6 Volt. (The microprocessor power supply 58 may be configured to reset at 5 Volts or 6 Volts to maintain the functionality of the microprocessor, which needs a minimum voltage to operate). For example, the bulk capacitance at the capacitor bank 60 may be provided in the range of about 45 μF to about 60 μF.

Figure 2:
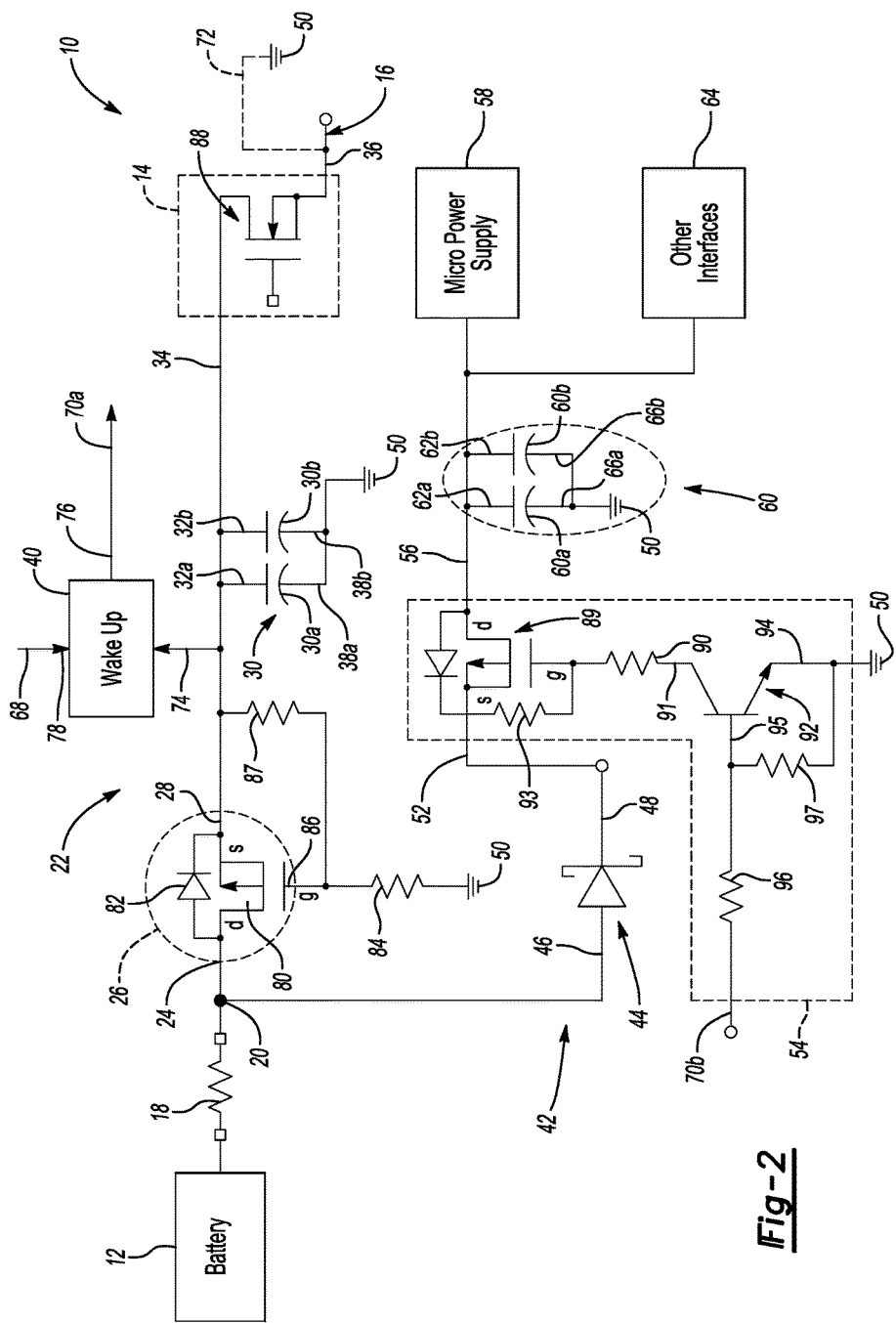
FIG. 2 is a circuit diagram, including some functional blocks, of the automotive transmission control circuit of claim 1, according to the principles of the present disclosure.

Referring now to FIG. 2, additional circuit components of the circuit 10 are illustrated. For example, the reverse battery protection module 26 comprises a MOSFET 80 and a body diode 82. Because the MOSFET 80 allows current flow in two opposite directions when turned on, the circuit 10 may allow bi-directional current flow to and from the high side driver 14, while still isolating the microprocessor power supply 58 and the microprocessor power supply input capacitor bank 60 from large transient current spikes and/or voltage drops. A gate resistor 84 is electrically connected to a third node 86 of the reverse battery protection module 26 and to ground 50. A gate-to-source resistor 87 is connected between gate and source of the reverse battery protection module 26. The high side driver 14 also comprises a MOSFET 88, in this example.

The battery isolation switch 54 also includes an isolation MOSFET 89. An s-terminal of the isolation MOSFET 89 is electrically connected to the blocking diode 44, a d-terminal of the isolation MOSFET 89 is electrically connected to the first ends 62a, 62b of the microprocessor power supply input capacitor bank 60 and to the microcprocessor power supply 58.

The battery isolation switch module 54 further includes a first battery isolation resistor 90 electrically connected to a g-terminal of the isolation MOSFET 89 and to a first terminal 91 of an enabler switch 92. The battery isolation switch module 54 further includes a second battery isolation resistor 93 electrically connected to the g-terminal and the s-terminal of the isolation MOSFET 89. The enabler switch 92 has a first terminal 91 electrically connected to the first battery isolation resistor 90, a second terminal 94 connected to ground 50, and a third terminal 95 electrically connected to a wake-up isolation resistor 96. The battery isolation switch module 54 further includes a third battery isolation resistor 97 electrically connected to the second and third terminals 94, 95 of the enabler switch 92. The wake-up isolation resistor 96 is electrically connected to the second node 76 of the wake-up module 40.

Figure 3:
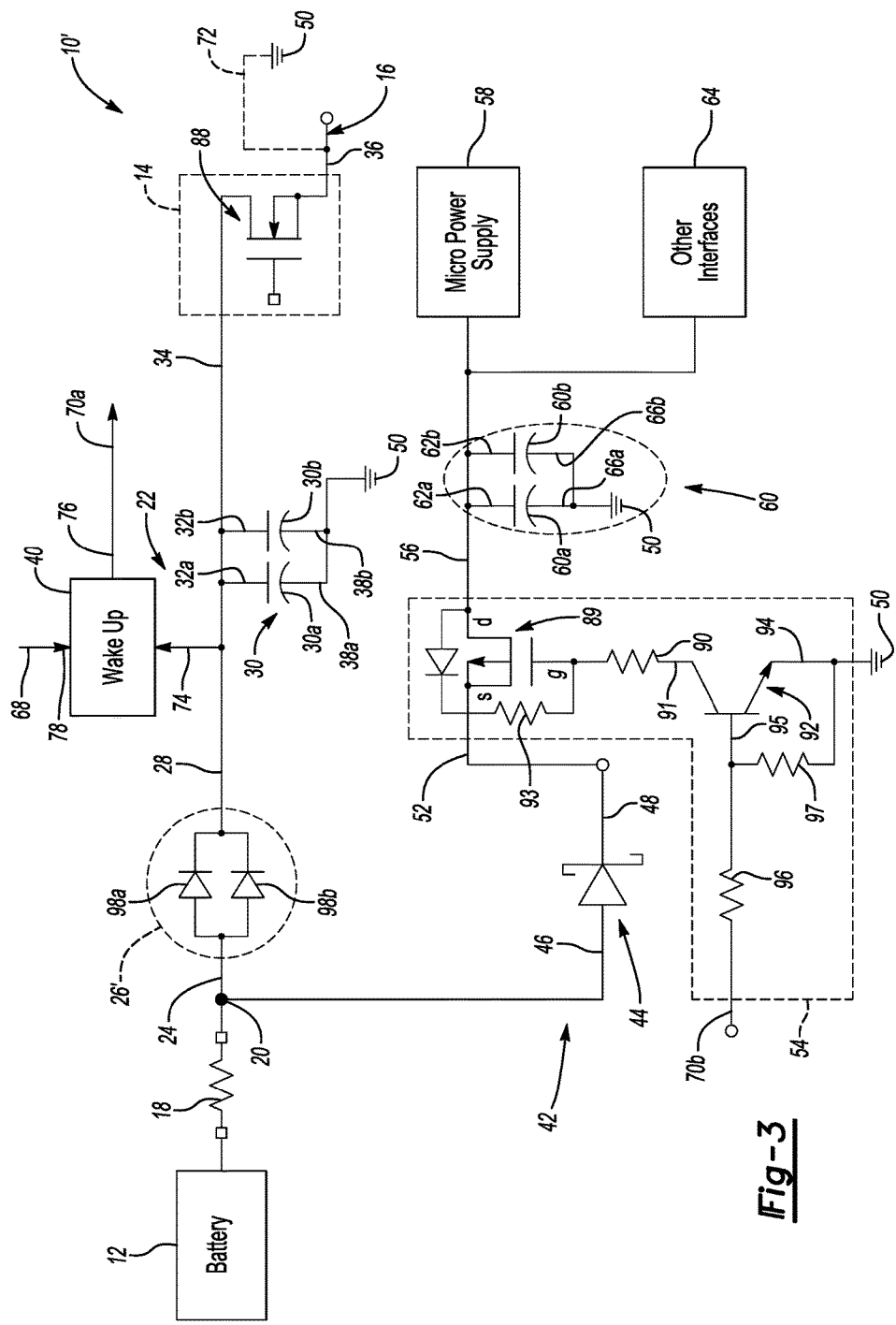
FIG. 3 is a circuit diagram, including some functional blocks, of another variation of an automotive control circuit, in accordance with the principles of the present disclosure.

Referring now to FIG. 3, another variation of the illustrated transmission control unit circuit is illustrated and designated at 10'. Most of the components shown in FIG. 3 are the same as previously shown in FIGS. 1 and/or 2; accordingly, any element having the same reference number as above should be understood to be the same as the element already described and shown, and such description is incorporation by reference into this paragraph. The only difference between the circuit 10 of FIG. 2 and the circuit 10' of FIG. 3, is in the reverse battery protection module 26'. Instead of using a bi-directional MOSFET 80 as shown in FIG. 2 with accompanying resistors 84, 87, a uni-directional reverse battery protection module 26' is included, which has two diodes 98a, 98b disposed in parallel with each other.

Figure 4:
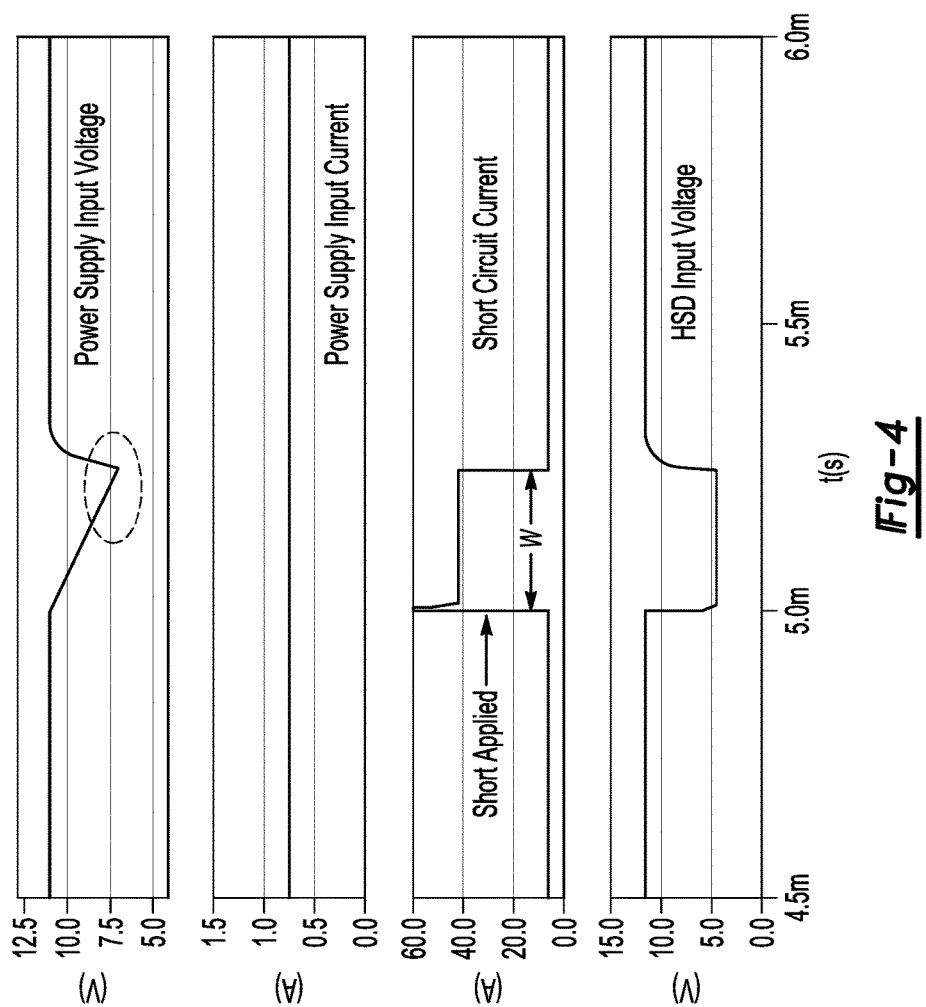
FIG. 4 is a graph illustrating power supply input voltage compared to power supply input current and HSD input voltage, according to the principles of the present disclosure.

Referring now to FIG. 4, a graph illustrating a simulation using elements of the present disclosure is provided. Time in milliseconds is plotted on the horizontal axis (abscissa). On the vertical axis (ordinate), there are four sections. In the top section, the microprocessor power supply input voltage is plotted. This is the voltage that it is desired to maintain above a predetermined threshold, such as 6 Volts, so that the microprocessor power supply 58 does not reset. In the second-to-top section, the microprocessor power supply input current is plotted. In the bottom section, high side driver input voltage is plotted.

In the third section down, the short circuit current is plotted; this is the current at the high side driver that is shorted. The short circuit detection time considered is 250 μsec, which is indicated at window w. The current spike may occur because the fastest that overcurrent can typically be detected is in the range of 150-250 μs. Once the overcurrent is detected, the high side driver is typically shut down.

At the beginning of the time plotted, the circuit is operating normally. Accordingly, the power supply input voltage is about 11 Volts, the power supply input current is 0.75 A (this is the load of the power supply 58), the current at the high side driver (before short) is about 5 A, and the high side driver input voltage is about 11.5 V. At time t=5 ms, a short-to-ground is applied at the high side driver, as shown in the third graph down. Thus, the current spikes to about 60 A and then maintains a steady state short circuit current of 41.5 A at the high side driver for approximately the 250 μs overcurrent period until the high side driver 14 is shut down. The power supply maintains the same load of 0.75 A, as shown in the second graph. Due to the high current at the high side driver, the high side driver input voltage drops to 5 V, as shown in the fourth graph. Finally, the top graph shows the voltage at the microprocessor power supply input, which drops to about 7 V, which is above the reset threshold. This illustrates that the architecture explained above is effective prevent the voltage at the power supply from dropping below 6 V.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between circuit) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

The term "circuit" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); or a combination of some or all of the above, such as in a system-on-chip.

None of the elements recited in the claims are intended to be a means-plus-function element within the meaning of 35 U.S.C. § 112(f) unless an element is expressly recited using the phrase "means for," or in the case of a method claim using the phrases "operation for," or "step for."

What is claimed is:

1. A connection circuit for connecting a voltage source to a main load, the connection circuit comprising:
   a Vbatt node configured to be electrically connected to a voltage source and a main load;
   a blocking diode electrically connected to the Vbatt node;
   a battery isolation switch module, the blocking diode being arranged in series between the battery isolation switch module and the Vbatt node;
   a microprocessor power supply input capacitor bank electrically connected to the battery isolation switch module at a first end of the power supply input capacitor bank, the battery isolation switch module being electrically connected between the blocking diode and the microprocessor power supply input capacitor bank, the microprocessor power supply input capacitor bank being connected to ground at a second end of the microprocessor power supply input capacitor bank, the first end of the microprocessor power supply input capacitor bank being configured to be further connected with a power supply, the blocking diode being arranged to prevent current from flowing back through the blocking diode from the microprocessor power supply input capacitor bank to the Vbatt node.

2. The connection circuit of claim 1, wherein the blocking diode is a Schottky diode.

3. The connection circuit of claim 2, further comprising a HSD capacitor bank electrically connected to the Vbatt node at a first end of the HSD capacitor bank, the HSD capacitor bank being connected to ground at a second end of the HSD capacitor bank.

4. The connection circuit of claim 3, further comprising a high side driver electrically connected to the Vbatt node at a first node of the high side driver, the first node of the high side driver being further electrically connected to the first end of the HSD capacitor bank, the high side driver being configured to be electrically connected to the main load at a second node of the high side driver.

5. The connection circuit of claim 4, the microprocessor power supply input capacitor bank comprising a plurality of first capacitors arranged in parallel with each other.

6. The connection circuit of claim 5, further comprising the power supply electrically connected to the first end of the microprocessor power supply input capacitor bank and to the battery isolation switch module, the power supply being a microprocessor power supply.

7. The connection circuit of claim 6, the HSD capacitor bank comprising a plurality of second capacitors arranged in parallel with each other.

8. The connection circuit of claim 7, further comprising a reverse battery protection module electrically connected to the Vbatt node at a first node of the reverse battery protection module, a second node of the reverse battery protection module being electrically connected to the first end of the HSD capacitor bank and to the high side driver.

9. The connection circuit of claim 8, wherein the reverse battery protection module comprises a MOSFET having a body diode.

10. The connection circuit of claim 9, further comprising a wake-up module having a first node in electrical connection with the second node of the reverse battery protection module, the first end of the HSD capacitor bank, and the high side driver, the wake-up module having a second node electrically connected to the battery isolation switch module, the wake-up module having a third node configured to be electrically connected to a wake-up signal source.

11. The connection circuit of claim 10, further comprising a gate resistor electrically connected to a third node of the reverse battery protection module and to ground, the connection circuit further comprising a gate-to-source resistor connected between a gate and a source of a reverse battery protection module MOSFET.

12. The connection circuit of claim 11, wherein the battery isolation switch module comprises an isolation MOSFET, an s-terminal of the isolation MOSFET being electrically connected to the blocking diode, a d-terminal of the isolation MOSFET being electrically connected to the first end of the microprocessor power supply input capacitor bank and to the power supply, the battery isolation switch module further comprising a first battery isolation resistor electrically connected to a g-terminal of the isolation MOSFET and to a first terminal of an enabler switch, the battery isolation switch module further comprising a second battery isolation resistor electrically connected to the g-terminal and the s-terminal of the isolation MOSFET, wherein the enabler switch has a first terminal electrically connected to the first battery isolation resistor, the isolation switch having a second terminal connected to ground and a third terminal electrically connected to a wake-up isolation resistor, the battery isolation switch module further comprising a third battery isolation resistor electrically connected to the second and third terminals of the enabler switch, the wake-up isolation resistor being electrically connected to the second node of the wake-up module.

13. The connection circuit of claim 12, wherein the high side driver comprises a high side driver MOSFET.

14. An automotive control circuit for controlling an automotive system, the automotive control circuit comprising:
a high side driver configured to receive power from a voltage source and drive a load;
a high side driver capacitor bank electrically connected to the high side driver;
a microprocessor power supply for powering the automotive control circuit, the microprocessor power supply configured to reset if voltage supplied to the microprocessor power supply drops below a predetermined threshold;
a microprocessor power supply input capacitor bank electrically connected to the microprocessor power supply; and
a blocking diode configured to isolate the microprocessor power supply input capacitor bank and the microprocessor power supply from a voltage drop caused by a short circuit of the high side driver to ground.

15. The automotive control circuit of claim 14, the blocking diode being a Schottky diode, the automotive control system further comprising a battery isolation switch module configured to isolate the microprocessor power supply from the voltage source in an off state of the microprocessor power supply.

16. The automotive control circuit of claim 15, the blocking diode being configured to restrict the rate of discharge of the microprocessor power supply input capacitor bank when the high side driver is short circuited to ground.

17. The automotive control circuit of claim 16, wherein the blocking diode is electrically connected to a Vbatt node, the Vbatt node being electrically connected to the high side driver and the high side driver capacitor bank, the blocking diode being arranged to prevent current from flowing back through the blocking diode from the power supply input capacitor bank to the Vbatt node and to an output of the high side driver.

18. The automotive control circuit of claim 17, wherein the microprocessor power supply capacitor bank provides a bulk capacitance in the range of about 45 to about 60 µF.

19. The automotive control circuit of claim 18, wherein the short circuit of the high side driver to ground causes a voltage at the microprocessor power supply drop but to be maintained by the control circuit above a predetermined threshold.

20. The automotive control circuit of claim 19, wherein the automotive control circuit has a 12 Volt voltage source connected to the Vbatt node and the microprocessor power supply causes a load demand in the range about 0.5 A to about 1.5 A, the predetermined threshold being greater than 6 Volts.

* * * * *